United States Patent [19]

Culp

[11] Patent Number: 5,136,201
[45] Date of Patent: Aug. 4, 1992

[54] PIEZOELECTRIC ROBOTIC ARTICULATION

[75] Inventor: Gordon W. Culp, Van Nuys, Calif.

[73] Assignee: Rockwell International Corporation, Seal Beach, Calif.

[21] Appl. No.: 685,176

[22] Filed: Apr. 15, 1991

Related U.S. Application Data

[63] Continuation of Ser. No. 515,888, Apr. 27, 1990, abandoned.

[51] Int. Cl.5 .......................................... H01L 41/08
[52] U.S. Cl. .................................................. 310/328
[58] Field of Search ........................................ 310/328

[56] References Cited

U.S. PATENT DOCUMENTS

| | | | |
|---|---|---|---|
| 3,902,085 | 8/1975 | Bizzigotti | 310/328 |
| 4,187,483 | 2/1980 | Whitney | 335/206 |
| 4,326,155 | 1/1980 | Griebeler | 318/576 |
| 4,459,526 | 7/1984 | Griebeler | 318/576 |
| 4,485,453 | 11/1984 | Taylor | 364/571 |
| 4,727,278 | 2/1988 | Staufenberg et al. | 310/317 |
| 4,775,352 | 10/1988 | Curran et al. | 446/301 |
| 4,821,594 | 4/1989 | Rosheim et al. | 294/106 |
| 4,855,961 | 8/1989 | Jaffe et al. | 367/7 |
| 4,928,030 | 5/1990 | Culp | 310/328 |
| 4,932,489 | 6/1990 | Evans et al. | 180/6.2 |
| 4,933,531 | 6/1990 | Ichikawa | 219/86.5 |
| 4,936,743 | 6/1990 | Stoss | 414/740 |
| 4,964,062 | 10/1990 | Ubhayakar et al. | 364/513 |
| 4,983,875 | 1/1991 | Masaki et al. | 310/328 |
| 4,999,536 | 3/1991 | Toda | 310/328 |

FOREIGN PATENT DOCUMENTS

| | | | |
|---|---|---|---|
| 0219972 | 11/1985 | Japan | 310/328 |
| 0085682 | 4/1987 | Japan | 310/328 |
| 0145309 | 6/1987 | Japan | 310/328 |
| 0189979 | 8/1987 | Japan | 310/328 |

Primary Examiner—Mark O. Budd
Assistant Examiner—Thomas M. Dougherty
Attorney, Agent, or Firm—H. Fredrick Hamann; Harry B. Field; Steven E. Kahm

[57] ABSTRACT

Actuators of rigid electrically actuatable material provide articulation for robotic limbs. Piezoelectric actuators, for example, may be used in various embodiments of robotic joints to rotate a cylindrical or spherical connection or to translate a rod. Opposing pairs of actuators engage in smooth walking motion and maintain a vise-like grip on the robot limb at all times. The traction surfaces of the actuators contact the robot limb with zero clearance. Unlike the use of conventional bearings, zero clearance and full area contact provide relatively large mechanical stiffness that allows very precise positioning of robot limbs without mechanical oscillations of the extremities. With adequate limb rigidity, slop is essentially eliminated from the joints. The smooth walking motion of the actuators achieves high mechanical efficiency by eliminating sliding friction. The joints operate in air or space vacuum without lubrication and with negligible heating. Relatively large forces and torques are developed at relatively slow speeds. Size of the robotic joints can range from relatively large to microscopic.

20 Claims, 3 Drawing Sheets

PIEZOELECTRIC ROBOTIC ARTICULATION

TECHNICAL FIELD

The present invention relates to articulation of robot limbs and, in particular, to robotic joints articulated by actuators comprising rigid electrically actuatable material.

This is a continuation of copending application Ser. No. 07/515,888 filed on Apr. 27, 1990 now abandoned.

BACKGROUND OF THE INVENTION

Engineering problems related to mass and speed traditionally have been solved by providing ever larger sources of energy. As a result, relatively inefficient power conversion has become commonplace. In the field of space exploration, studies suggest that efficient robots of many designs are needed as precursors to manned exploration. Robots generally weight and cost less than manned space vehicles, and they do not require elaborate life support systems.

Piezoelectric actuators are among the devices being investigated for converting stored electric power to motive force in space vehicles. Piezoelectric actuators have advantages for use in remote and extreme environments because of their high efficiency and ability to operate on direct current without the need for lubrication or cooling. Detailed descriptions of piezoelectric actuators and electronic drive systems that produce piezoelectric "smooth walking" are set forth in the following co-pending U.S. Patent Applications, which are incorporated herein by reference: Ser. No. 252,197 filed Sep. 30, 1988, and Ser. No. 488,548 filed Mar. 5, 1990.

A chronic problem in some robotic joints is an effect termed slop. Slop encompasses phenomena such as gear backlash, bearing clearance play, elastic bending, and mechanical compliance that collectively result in failure of a robotic limb to extend to a position with the desired accuracy and steadiness. In space applications, robotic joints with minimal slop are needed in sizes ranging from large to microscopic. Electromagnetic actuators for robots are limited to relatively large embodiments because the surface area to volume ratio of miniaturized components increases dramatically, resulting in aggravated flux leakage. Furthermore, magnetic actuators dissipate power continuously in the form of current flow when maintaining a constant force.

In contrast to magnetic actuators, piezoelectric actuators are ideal for small scale applications. Electric field flux leakage does not increase dramatically as component size diminishes because piezoelectric layer thickness, and thus dielectric edge area, also decreases proportionally. The relative structural strength of piezoelectric actuators increases with decreasing size because of the importance of surface area to structural strength. Miniature components allow relatively higher stress levels, which improve specific performance. Furthermore, piezoelectric actuators apply a constant force once the appropriate amount of electric charge is stored in the piezoelectric material. As long as the charge persists, no further input of electric energy is required to maintain the applied force.

One of the preferred configurations for a walking robot comprises six legs with each leg having two joints. Efficient walking is the result of hundreds of millions of years of evolutionary development exemplified by the seemingly endless variety of six-legged insects. The most common mode of insect walking utilizes an alternating tripod. This mode is fast and stable as long as the center of gravity remains inside the triangles of both tripods. A one leg at a time mode can be used for scaling high obstacles. In this mode, the front legs reach upward while the rear two pair provide support and stability. This motion requires greater angular freedom of movement of the legs than is required for just walking on a level surface.

In the field of robotic vehicles for space exploration, there is a need for a robotic walking system suitable for dimensions ranging from microscopic to very large. The system must include flexible joints that can be actuated efficiently, reliably, and without slop.

SUMMARY OF THE INVENTION

The present invention is a mechanical robotic joint having actuators comprising rigid electrically actuatable material. The actuators may comprise piezoelectric material, for example, and may be used in various embodiments of the joint to rotate a cylindrical or spherical connection or to translate a rod.

Piezoelectric actuators at the joints of a robot provide motive power and support for the robot limbs. Piezoelectric smooth walking comprises alternate traction and retracing of actuator pairs in a manner that matches the velocity of the actuator traction surface with the velocity of the robot limb at all times during the traction portion of the actuator cycle. The use of piezoelectric actuators eliminates sliding friction in the traction cycle, thereby producing negligible frictional heat and achieving relatively high electromechanical efficiency. Smooth walking actuators also provide smooth acceleration, a return to true electrical and mechanical zero states after stimulation ceases, and prolonged life of the traction surfaces that support the desired load.

Smooth walking by opposing pairs of actuators maintains a vise-like grip on the robot limb at all times. The entire traction surfaces of the actuators contact the robot limb with zero clearance. Conventional rolling or sliding bearings are not needed. Zero clearance and full area contact provide a relatively large mechanical stiffness that allows very precise positioning of robot limbs without mechanical oscillations of the extremities. With adequate limb rigidity, slop is essentially eliminated from the joints.

Piezoelectric elements are electromechanically reciprocal, working equally well as actuators or as force sensors. Thus, piezoelectric actuators can sense the attitude and state of force in each articulated joint of a robot, providing feedback to an actuator controller. Piezoelectric actuator state sensors can operate in combination with other sensors to control robot behavior in a wide variety of exploratory encounters, such as rough terrain and high obstacles.

BRIEF DESCRIPTION OF THE DRAWINGS

The following Description of the Preferred Embodiments makes reference to the accompanying Drawings, in which.

DESCRIPTION OF THE PREFERRED EMBODIMENTS

Figure 1:
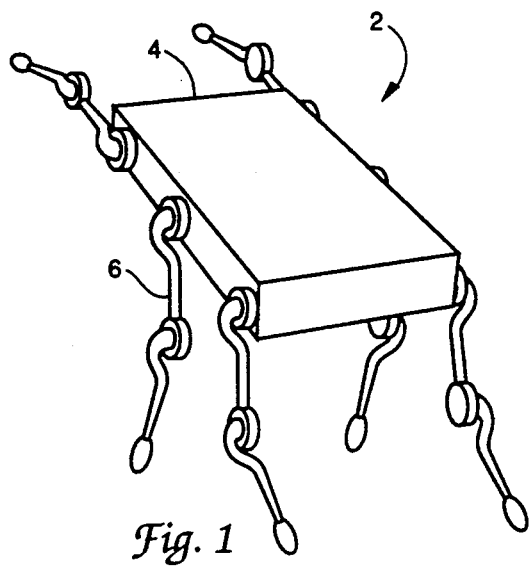
FIG. 1 is a perspective view of a six-legged walking robot having twelve cylindrical joints of the present invention.

FIG. 1 is a perspective view of a simplified dual-tripod walking robot 2, having a body 4 and six articulable legs, such as leg 6. In actual robots, flexible dust covers (not shown) are generally used to exclude contamination from the robotic joints. The actuators of the joints of the present invention comprise rigid electrically actuatable material. For simplicity of description, but not limitation, the actuators of the preferred embodiments of the present invention are described as comprising piezoelectric material in the form of layered piezoelectric dimorphs.

Figure 2:
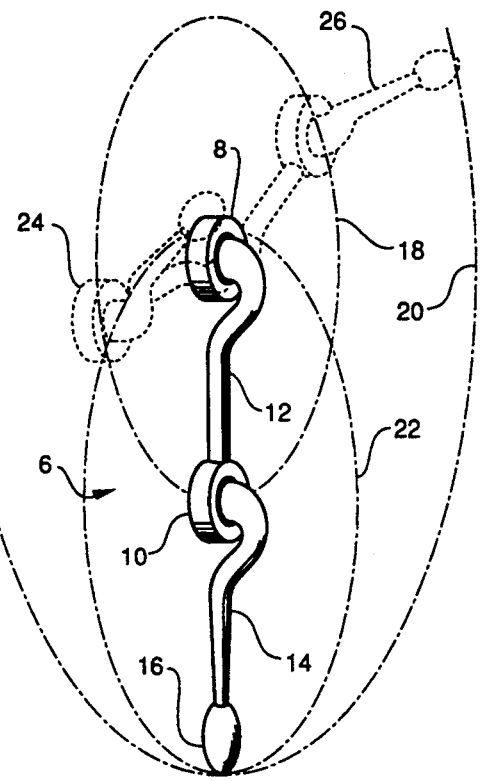
FIG. 2 is a perspective view illustrating the range of motion of a leg of the robot of FIG. 1.

FIG. 2 illustrates the range of movement of leg 6. Leg 6 comprises a piezoelectric hip joint 8, a similar piezoelectric knee joint 10, an upper leg segment 12, a lower leg segment 14, and a foot 16. The dashed line circles 18, 22, and 20 indicate the extent of motion for upper leg 12, lower leg 14, and foot 16, respectively. In an embodiment in which upper leg 12 and lower leg 14 are approximately the same length, the legs may be folded for storage as shown by dotted line 24. Dotted line 26 illustrates the position of a front leg of robot 2 extended for climbing a high obstacle.

Figure 3:
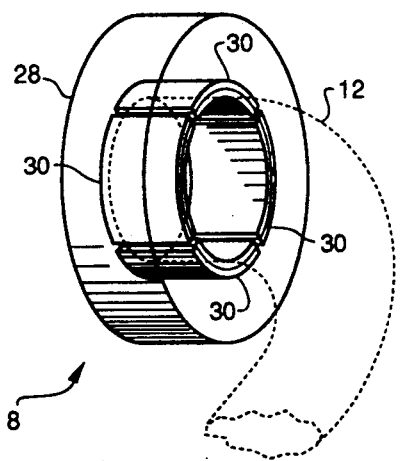
FIG. 3 is a transparent perspective view of a joint of a leg of the robot of FIG. 1.

FIG. 3 is a transparent perspective view of piezoelectric joint 8. Joint 8 is substantially the same as knee joint 10 and the other joints of robot 2. As shown in FIG. 3, joint 8 comprises a cylindrical articulator housing 28 and two pairs of opposing piezoelectric actuators 30. Actuators 30 are mounted on the interior cylindrical surface of housing 28, and may include a plurality of opposing pairs. Actuators 30 are shaped as cylindrical arcs with traction surfaces that engage the outer cylindrical surface of the end of leg 12 (shown in phantom) inserted into housing 28. Opposing pairs of actuators 30 act together to provide a vise-like grip and to rotate leg 12 by smooth walking motion of actuator traction surfaces against the cylindrical surface of leg 12. Electrical leads, which are omitted from all the Figures for reasons of clarity, are connected to stimulate each of the actuators as is well known in the art.

Figure 4:
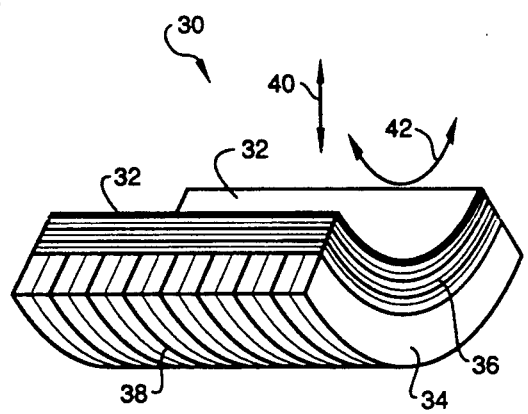
FIG. 4 is a detailed perspective view of a cylindrically shaped piezoelectric actuator of the robot of FIG. 1.

FIG. 4 is a perspective view of a piezoelectric actuator 30 of FIG. 3. Actuator 30 comprises layered segments including a traction surface 32, a piezoelectric lifter 34, a piezoelectric tangenter 36, and a mounting surface 38. Lifter 34 comprises layers of piezoelectric material and electrodes arranged for shear deformation in directions indicated by arrows 40. Tangenter 36 comprises layers of piezoelectric material and electrodes arranged for shear deformation in directions indicated by arrows 42. Lifter 34 controls the gripping force applied by traction surface 32 against leg 12, while tangenter 36 controls the tangential force applied by traction surface 32 to rotate leg 12. When lifter 34 and tangenter 36 are stimulated in an electrical loop by an electrical controller (not shown), traction surface 32 moves cyclically along a predetermined path that is the vector sum of the lifter and tangenter motions.

Actuator 30 may include a piezoelectric axier (not illustrated) that acts in a direction parallel to the axis of rotation of the cylindrical portion of leg 12. The axier may be actuated in response to a leg position detecting means (not shown) to keep leg 12 centered in housing 28. In this embodiment, leg centering is provided by electrical control rather than conventional methods such as limit stops or thrust bearings. The axier can also be used to translate an extension of the cylindrical portion of leg 12 to increase or decrease the width of the stance of feet 16.

Figure 5:
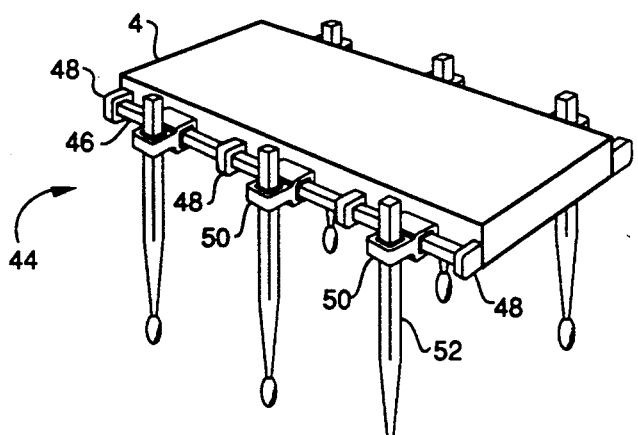
FIG. 5 is a perspective view of a robot having six translating legs and joints of the present invention.
Figure 6:
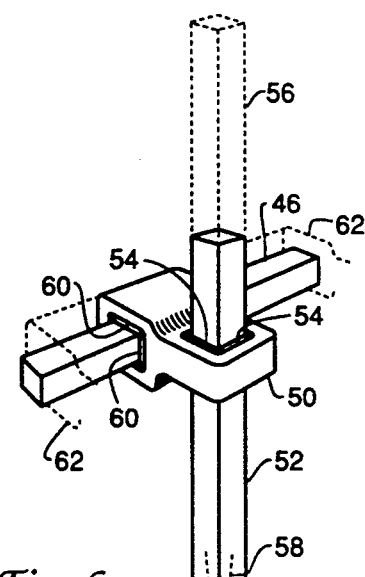
FIG. 6 is a perspective view illustrating the range of motion of a leg of the robot of FIG. 5.

FIG. 5 is a perspective view of a robot 44 comprising a body 4, horizontal rods 46, rod supports 48, actuator housings 50, and six vertical legs 52. FIG. 6 is an enlarged view of a leg 52 and an actuator mechanism of robot 44. As illustrated in FIG. 6, leg 52 and rod 46 are square in cross section, and housing 50 contains pairs of piezoelectric actuators 54 and 60. Two pairs of opposing actuators 54 position leg 52 in the vertical direction, as illustrated by dotted lines 56 and 58. Two pairs of opposing actuators 60 position leg 52 along horizontal rod 46 between extreme positions of housing 50 indicated by dotted lines 62. The extent of mobility of foot 64 is indicated by dashed line 66.

Figure 7:
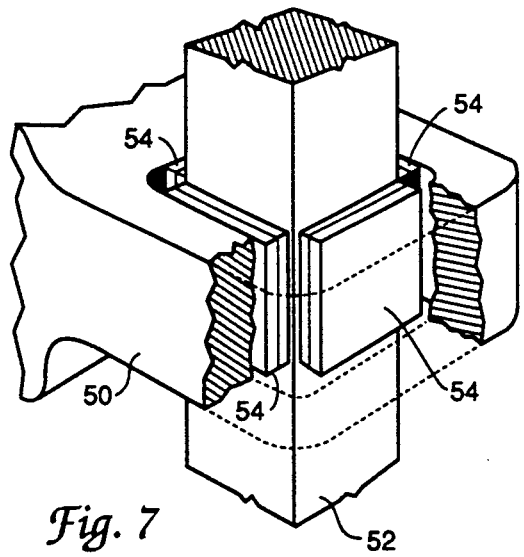
FIG. 7 is a cutaway perspective view of a translating joint of the robot of FIG. 5.

FIG. 7 is a cutaway view of the portion of housing 50 that engages vertical leg 52. The portion of housing 50 that engages horizontal rod 46 is substantially the same as the portion illustrated but oriented at a right angle. Two pairs of opposing actuators 54 are mounted on the inner surface of a square borehole through housing 50. Actuators 54 utilize smooth walking motion to grip and vertically position leg 52.

Figure 8:
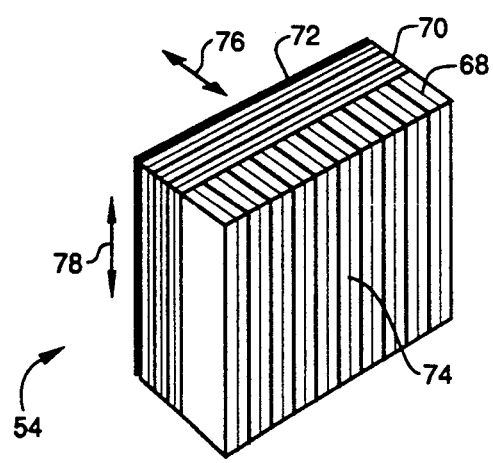
FIG. 8 is a detailed perspective view of a translating piezoelectric actuator of the robot of FIG. 5.

As illustrated in FIG. 8, each actuator 54 comprises a lifter 68, a tangenter 70, a traction surface 72, and a mounting surface 74. Lifter 68 provides actuator motion in the direction of arrows 76 to apply normal force to leg 52, and tangenter 70 provides motion in the direction of arrows 78 to apply translational force to leg 52.

Actuator 54 may include a second tangenter (not shown) that positions traction surface 72 in a direction perpendicular to both directions 76 and 78. The second tangenter has a small stroke relative to the stroke of tangenter 70 and is used to keep leg 52 centered in housing 50 as force vectors change during robot walking. The second tangenter provides full position control without the need for limit stops or thrust bearings.

Figure 9:
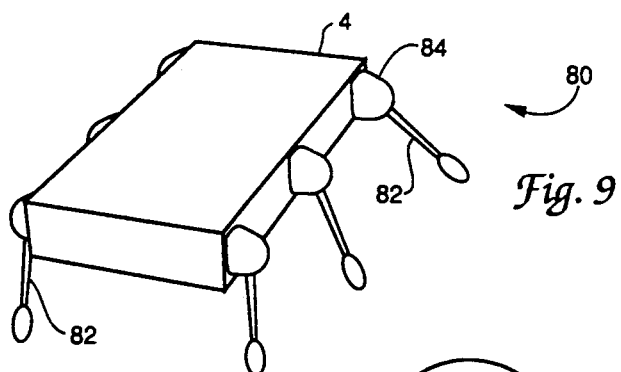
FIG. 9 is a perspective view of a six-legged walking robot with pivoting legs and spherical joints of the present invention.
Figure 10:
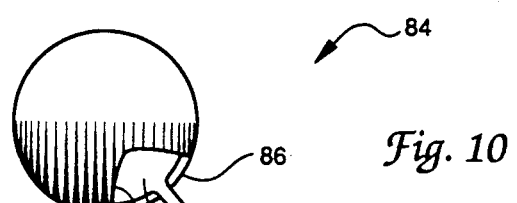
FIG. 10 illustrates the range of motion provided by a spherical joint for a leg of the robot of FIG. 9.

FIG. 9 is a perspective view of a robot 80 having a body 4, six legs 82, and leg joints 84 connecting legs 82 to body 4. FIG. 10 is an enlarged view of joint 84, which comprises a housing 86 with an opening 88 into a spherical cavity or socket. Leg 82 includes a foot 90 and a ball 92, which is held within the spherical socket of housing 86 with leg 82 extending through opening 88. Piezoelectric actuators mounted in the spherical gap between housing 86 and ball 92 position ball 92 with three rotary degrees of freedom, two of which position foot 90 anywhere on a spherical surface segment indicated by dotted line 94.

Figure 11:
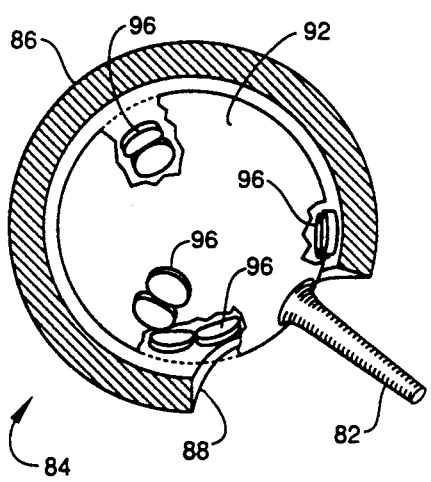
FIG. 11 is a cutaway view of a spherical joint of the robot of FIG. 9.

FIG. 11 is a cutaway view of joint 84 illustrating housing 86, opening 88, ball 92, leg 82 attached to ball 92, and a plurality of piezoelectric actuator pairs 96 affixed to the spherical interior surface of housing 86. Actuator pairs 96 may be equally spaced, for example, at the apexes of a tetrahedron inscribed in housing 86. In the embodiment illustrated in FIGS. 10 and 11, opening 88 is roughly triangular to limit the angular movement of leg 82. The mobility limit shown by dotted line 94 is roughly a triangle cut from a spherical surface.

In the embodiment of robot 80 illustrated in FIGS. 9–11, actuators 96 do not normally rotate ball 92 about the axis of leg 82. However, in an alternative embodiment of leg 82 that is bent (not illustrated), rotation of ball 92 to produce axial rotation of leg 82 may be combined advantageously with the two-axis pivoting motion of leg 82 described above.

Figure 12:
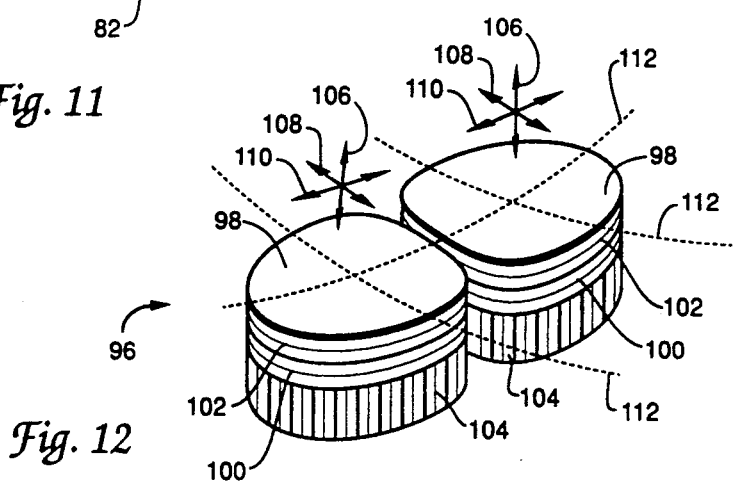
FIG. 12 is a detailed perspective view of a pair of three-axis spherically shaped piezoelectric actuators of the robot of FIG. 9.

FIG. 12 is a perspective view of a pair of three-axis piezoelectric actuators 96 of FIG. 11. Each actuator 96 comprises a spherical traction surface 98, a first tangenter 100, a second tangenter 102, and a lifter 104. With appropriate electrical stimulus, lifter 104 positions surface 98 in the direction of arrows 106, tangenter 100 positions surface 98 in the direction of arrows 108, and tangenter 102 positions surface 98, in the direction of arrows 110. These motions are independently and simultaneously controllable. The motion of traction surface 98 is the vector sum of the lifter and tangenter motions and comprises spherical radial motion and motion parallel to the surface of ball 92, indicated by dotted lines 112.

Many variations of the piezoelectric joint of the present invention are possible. For example, square rod 46 and legs 52 of robot 44 of FIG. 5 may be combined with joints 8 of FIG. 3. Thus, it can be seen that a great many combinations of 2- and 3-axis piezoelectric actuators may be used in a robotic joint to achieve a desired range of motion for a robot limb. The principles described herein are equally applicable to large and small robots, including positioners, parts pickers, welders, painters, inspectors, and machine tools. A primary benefit of the use of smooth walking piezoelectric shear actuators in robotic joints is the efficiency, rigidity, and accuracy of positioning.

In scaling the present invention to microscopic dimensions, piezoelectric layers and electrodes may be deposited epitaxially using appropriate masks. Electric loop wiring and interconnections may also be deposited. Electrical stimulation and coupling components may be incorporated into the electrical loops at the time of deposition. Controller components may be deposited separately and may be incorporated into the same structure as that of the piezoelectric actuators. Mechanical components also may be grown in place by topographic deposition methods, for example.

Although the present invention has been described with respect to specific embodiments thereof, various changes and modifications may be suggested to one skilled in the art. In particular, the actuators of the present invention may comprise any rigid electrically activated material that provides the forces and motions described above. Other than piezoelectric material, for example, the actuators may comprise electrostrictive, electromagnetic, magnetoremanent, magnetostrictive, piezocomposite, ferroelectric, and thermoexpansive materials. The use of capacitive and inductive materials in the same electrically addressable actuator segment allows mutual temporary electrical energy storage. This benefits operating efficiency when the capacitance and inductance oscillate resonantly while the mechanical force and positioning components are added vectorially by the actuator. In view of these possible variations, it is intended that the present invention encompass such changes and modifications as fall within the scope of the appended claims.

I claim:

1. A robotic articulation comprising:
    an articulator housing attached to a robot body, at least two pair of actuators mounted in said housing, each of said actuators comprising a stack of electrically actuable material having a lifter segment, a tangenter segment, and a traction surface for engaging an articulable robot limb having an end extending within said housing,
    wherein the pairs of actuators alternately act in a vice-like manner to grip and move said limb.

2. The robotic articulation of claim 1 wherein each pair actuators operates in a cycle having the steps of,
    contacting the limb while moving at the same speed as the limb, in order to eliminate rubbing friction during contact,
    moving the limb,
    lifting off the limb while moving at the same speed as the limb to eliminate rubbing friction during contact,
    retracing to begin another cycle.

3. The robotic articulation of claim 1, wherein said end of said limb comprises a rod having a rectangular cross section, said housing includes a rectangular opening, and said actuators comprise two pairs of opposing actuators mounted in said rectangular opening for engaging said rod.

4. The robotic articulation of claim 1, wherein said end of said limb comprises a cylindrical shaft, said housing includes a cylindrical opening, and said actuators comprise at least two pairs of opposing cylindrical arcs mounted in said cylindrical opening for engaging said cylindrical shaft.

5. The robotic articulation of claim 4, wherein said robot limb further comprises an upper leg and a lower leg connected by a knee joint.

6. The robotic articulation of claim 5, wherein said knee joint comprises a knee housing and a plurality of knee actuators mounted in said knee housing for engaging an end of said lower leg extending within said knee housing.

7. The robotic articulation of claim 2, wherein said end of said limb comprises a rod having a rectangular cross section, said housing includes a rectangular opening, and said actuators comprise two pairs of opposing actuators mounted in said rectangular opening for engaging said rod.

8. The robotic articulation of claim 2, wherein said end of said limb comprises a cylindrical shaft, said housing includes a cylindrical opening, and said actuators comprise at least two pairs of opposing cylindrical arcs mounted in said cylindrical opening for engaging said cylindrical shaft.

9. The robotic articulation of claim 7, wherein the electrically actuable material of the actuators is a piezoelectric material.

10. The robotic articulation of claim 3, wherein the electrically actuable material of the actuators is a piezoelectric material.

11. The robotic articulation of claim 1, wherein said end of said limb comprises a ball, said housing comprises a spherical cavity and said pairs of actuators are mounted on said spherical cavity and engage said ball.

12. The robotic articulation of claim 1, wherein the electrically actuable material of the actuators is a piezoelectric material.

13. The robotic articulation of claim 4, wherein the electrically actuable material of the actuators is a piezoelectric material.

14. The robotic articulation of claim 11, wherein the electrically actuable material of the actuators is a piezoelectric material.

15. The robotic articulation of claim 2, wherein said end of said limb comprises a ball, said housing comprises a spherical cavity and said pairs of actuators are mounted on said spherical cavity and engage said ball.

16. The robotic articulation of claim 2, wherein the electrically actuable material of the actuators is a piezoelectric material.

17. The robotic articulation of claim 8, wherein said robot limb further comprises an upper leg and a lower leg connected by a knee joint.

18. The robotic articulation of claim 17, wherein said knee joint comprises a knee housing and a plurality of knee actuators mounted in said knee housing for engaging an end of said lower leg extending within said knee housing.

19. The robotic articulation of claim 8, wherein the electrically actuable material of the actuators is a piezoelectric material.

20. The robotic articulation of claim 15, wherein the electrically actuable material of the actuators is a piezoelectric material.

* * * * *